(12) United States Patent
Kim et al.

(10) Patent No.: US 8,803,565 B2
(45) Date of Patent: Aug. 12, 2014

(54) DRIVING CIRCUITS, POWER DEVICES AND ELECTRONIC DEVICES INCLUDING THE SAME

(75) Inventors: Ho-jung Kim, Suwon-si (KR);
Jae-kwang Shin, Anyang-si (KR);
Jae-joon Oh, Seongnam-si (KR);
Jong-seob Kim, Hwaseong-si (KR);
Hyuk-soon Choi, Hwaseong-si (KR);
In-jun Hwang, Hwaseong-si (KR);
Ki-ha Hong, Cheonan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 96 days.

(21) Appl. No.: 13/064,264

(22) Filed: Mar. 15, 2011

(65) Prior Publication Data

US 2011/0273221 A1 Nov. 10, 2011

(30) Foreign Application Priority Data

May 4, 2010 (KR) .................... 10-2010-0042085

(51) Int. Cl.
*H03K 17/16* (2006.01)

(52) U.S. Cl.
USPC ........... 327/112; 327/381; 327/427; 327/434; 326/83

(58) Field of Classification Search
CPC .................. H03K 17/08122; H03K 17/04123; H03K 17/284; H03K 2217/0081
USPC ................. 327/108–112, 381, 389, 392–396, 327/398–401, 427, 434–437; 326/82, 83
See application file for complete search history.

(56) References Cited

U.S. PATENT DOCUMENTS

| | | | |
|---|---|---|---|
| 5,872,477 A * | 2/1999 | Price, Jr. | 327/392 |
| 6,114,895 A * | 9/2000 | Stephens | 327/391 |
| 6,307,409 B1 * | 10/2001 | Wrathall | 327/112 |
| 6,400,177 B1 * | 6/2002 | Yoshizaki | 326/30 |
| 6,538,479 B2 * | 3/2003 | Bellomo et al. | 327/108 |
| 6,917,227 B1 * | 7/2005 | Ochi | 327/111 |
| 6,943,611 B2 | 9/2005 | Braun et al. | |
| 7,123,060 B1 * | 10/2006 | Chen et al. | 327/108 |
| 7,196,890 B2 | 3/2007 | Smith | |
| 7,786,759 B2 * | 8/2010 | Huang et al. | 326/68 |
| 8,564,234 B2 * | 10/2013 | Kim | 318/432 |
| 2008/0150581 A1 * | 6/2008 | Huang et al. | 326/80 |
| 2008/0153215 A1 | 6/2008 | Sandhu et al. | |
| 2008/0265980 A1 | 10/2008 | Reichl et al. | |
| 2010/0020450 A1 * | 1/2010 | Guillot et al. | 361/18 |
| 2011/0273116 A1 * | 11/2011 | Kim | 318/3 |

FOREIGN PATENT DOCUMENTS

JP 2003078401 A 3/2003

OTHER PUBLICATIONS

U.S. Office Action issued in U.S. Appl. No. 12/929,779, mailed Mar. 7, 2013.

* cited by examiner

*Primary Examiner* — Patrick O'Neill
(74) *Attorney, Agent, or Firm* — Harness, Dickey & Pierce, P.L.C.

(57) ABSTRACT

A power device includes a switching device having a control terminal and an output terminal; and a driving circuit configured to provide a driving voltage to the control terminal such that a voltage between the control terminal and the output terminal remains less than or equal to a critical voltage. A rise time required for the driving voltage to reach a target level is determined according to current-voltage characteristics of the switching device. And, when the voltage between the control terminal and the output terminal exceeds the critical voltage, leakage current is generated between the control terminal and the output terminal.

23 Claims, 14 Drawing Sheets

DRIVING CIRCUITS, POWER DEVICES AND ELECTRONIC DEVICES INCLUDING THE SAME

CROSS-REFERENCE TO RELATED APPLICATION(S)

This application claims priority under 35 U.S.C. 119 to Korean Patent Application No. 10-2010-0042085, filed on May 4, 2010, in the Korean Intellectual Property Office, the entire contents of which are incorporated herein by reference.

BACKGROUND

1. Field

Example embodiments relate to driving circuits, power devices and electric devices including the same.

2. Description of the Related Art

Power devices transform input power received from an external source into output power having a voltage or current with a level desired by a user. Power devices then supply the output power to other devices. Power devices are used in home appliances such as portable terminals, laptop computers, and the like. Power devices are also used for driving motors, which are mounted on and utilized in environmentally friendly (or "green") vehicles such as electric cars, hybrid cars, fuel-cell cars, and the like.

SUMMARY

Example embodiments provide power devices using a relatively high voltage. According to at least some example embodiments, the power devices include a switching device in which the generation of leakage current may be reduced.

Example embodiments also provide driving circuits (e.g., gate driving circuits) capable of reducing leakage current that may be generated between a control terminal (e.g., a gate) and an output terminal (e.g., a source) of a switching device (e.g., a transistor).

Additional aspects will be set forth in part in the description which follows, and in part, will be apparent from the description or may be learned by practice of example embodiments.

At least one example embodiment provides a power device. According to at least this example embodiment, a power device includes: a switching device having a control terminal and an output terminal; and a driving circuit. The driving circuit is configured to apply a driving voltage to the control terminal so that a voltage between the control terminal and the output terminal remains less than or equal to a critical voltage. A rise time, which refers to a period of time required for the driving voltage to reach a target level, is determined according to current-voltage characteristics of the switching device. Further, when the voltage between the control terminal and the output terminal exceeds the critical voltage, leakage current is generated between the control terminal and the output terminal.

According to at least some example embodiments, the rise time of the driving voltage may be determined to increase according to the current-voltage characteristics of the switching device.

The driving circuit may delay a control signal for controlling the supply of the driving voltage for a delay period, and apply the driving voltage to the control terminal after the delay period. According to at least one example embodiment, the driving circuit may include: a delay circuit configured to delay the control signal for the delay period to output a delayed control signal; a pull-up circuit configured to apply a power supply voltage to the control terminal when the delayed control signal is active; and a pull-down circuit configured to apply a ground voltage to the control terminal when the control signal is inactive.

The delay circuit may include a plurality of delay cells that are serially connected to one another. Each of the plurality of delay cells may be configured to delay an input signal for a unit delay period.

Each of the plurality of delay cells may include: a delay circuit and a fuse configured to activate the delay circuit. The fuse may be cut based on the rise time determined according to the current-voltage characteristics of the switching device. In more detail, each of the plurality of delay cells may include a resistor, at least one capacitor, a first fuse connected in parallel with the resistor, and at least one second fuse serially connected to the at least one capacitor. Each of the delay cells may be activated when the first fuse is cut, but the second fuse is not cut.

According to at least one other example embodiment, the delay circuit may include: a plurality of delay cells which are serially connected to one another; and a delay cell selection circuit configured to apply a selection signal for selecting at least a portion of the plurality of delay cells based on the rise time determined according to the current-voltage characteristics of the switching device. Each delay cell may be configured to delay an input signal for a unit delay period. The delay cell selection circuit may include a plurality of E-fuses connected to the plurality of delay cells, respectively. The plurality of E-fuses may be cut based on the rise time determined according to the current-voltage characteristics of the switching device.

In at least this example embodiment, each of the plurality of delay cells may include: a resistor; at least one capacitor; a resistor switch connected in parallel with the resistor; and at least one capacitor switch serially connected to the at least one capacitor. The resistor switch and the at least one capacitor switch may be turned on/off according to the selection signal provided by the delay cell selection circuit.

According to at least some example embodiments, the driving voltage having a multi-step waveform in which at least one of a width and a height of each step varies according to the current-voltage characteristics of the switching device.

In at least one alternative example embodiment, the driving circuit may include a driving signal generation circuit configured to generate a driving signal having a plurality of pulses sequentially turned on/off. A pulse width of each of the plurality of pulses may be determined according to the current-voltage characteristics of the switching device. The driving circuit may further include: a plurality of voltage generation circuits configured to generate different levels of voltages; and a driving voltage providing circuit configured to apply a voltage generated by one of the plurality of voltage generation circuits to the control terminal as the driving voltage, according to the driving signal. The plurality of pulses may determine a time at which a voltage corresponding to a next step, with respect to a current step in the driving voltage having the multi-step waveform, is applied.

The driving signal generation circuit may include: an oscillator configured to generate a clock signal having a given, desired or predetermined period; a pulse width control circuit configured to control a pulse width of the clock signal based on the current-voltage characteristics of the switching device; and a pulse generation circuit configured to sequentially generate the plurality of pulses having the controlled pulse width, when a pulse enable signal is active. The pulse width control circuit may control the pulse width of the clock signal in proportion to the rise time of the driving voltage.

The driving voltage providing circuit may include a plurality of switches connected to the plurality of voltage generation circuits, respectively. Each of the plurality of switches may be turned on/off according to a logic level of the driving signal.

The switching device may be a transistor having a gate, a source, and a drain. The control terminal may correspond to the gate and the output terminal may correspond to the source.

According to at least some example embodiments, an electric vehicle includes a power device as described above and an electric motor. The power device is configured to generate a power supply voltage by at least one of up-converting, down-converting and inverting a supply voltage from a battery. The electric motor is configured to drive the at least electric vehicle according to the power supply voltage.

According to at least some example embodiments, an electric device includes: a power device as described above and electric circuit. The power device is configured to generate a power supply voltage by at least one of up-converting, down-converting and inverting a supply voltage. The electric circuit is configured to receive the power supply voltage and operates according to the power supply voltage.

At least one other example embodiment provides a driving circuit (e.g., a gate driving circuit) configured to provide a driving voltage to a control terminal (e.g., a gate) of a switching device (e.g., a transistor). According to at least one example embodiment, the driving circuit includes: a delay circuit configured to delay a control signal for controlling the supply of the driving voltage for a delay period to generate a delayed control signal; a pull-up circuit configured to apply a power supply voltage to the control terminal when the delayed control signal is active; and a pull-down circuit configured to apply a ground voltage to the control terminal when the control signal is inactive. The delay period is controlled according to a rise time, which refers to a period of time required for the driving voltage to reach a target level. The rise time of the driving voltage is determined based on current-voltage characteristics of the switching device such that a voltage between the control terminal and an output terminal of the switching device remains less than or equal to a critical voltage. When the voltage between the control terminal and the output terminal exceeds the critical voltage, leakage current is generated between the control terminal and the output terminal.

According to at least one example embodiment, the delay circuit may include a plurality of delay cells serially connected to one another. Each of the plurality of delay cells may include a delay circuit and a fuse that activates the delay circuit. The fuse may be cut based on the rise time determined according to the current-voltage characteristics of the switching device.

According to at least one alternative example embodiment, the delay circuit may include a plurality of delay cells serially connected to one another; and a delay cell selection circuit configured to provide a selection signal configured to select at least a portion of the plurality of delay cells based on the rise time determined according to the current-voltage characteristics of the switching device. The delay cell selection circuit may include a plurality of E-fuses connected to the plurality of delay cells, respectively. The plurality of E-fuses may be cut based on the rise time determined according to the current-voltage characteristics of the switching device.

At least one other example embodiment provides a driving circuit (e.g., a gate driving circuit) configured to provide a driving voltage to a control terminal (e.g., a gate) of a switching device (e.g., a transistor). According to at least this example embodiment, the driving circuit includes: a driving signal generation circuit configured to generate a driving signal having a plurality of pulses which are sequentially turned on/off; a plurality of voltage generation circuits configured to generate different levels of voltages; and a driving voltage providing circuit configured to apply a voltage generated by one of the plurality of voltage generation circuits to the control terminal according to the driving signal to serve as the driving voltage. A pulse width of each of the plurality of pulses is determined according to current-voltage characteristics of the switching device. A rise time, which refers to a period of time required for the driving voltage to reach a target level, is determined based on the current-voltage characteristics of the switching device such that a voltage between the control terminal and an output terminal of the switching device remains less than or equal to a critical voltage. When the voltage between the control terminal and the output terminal exceeds the critical voltage, leakage current is generated between the control terminal and the output terminal.

According to at least some example embodiments, the driving signal generation circuit may include: an oscillator configured to generate a clock signal having a given, desired or predetermined period; a pulse width control circuit configured to control a pulse width of the clock signal based on the current-voltage characteristics of the switching device; and a pulse generation circuit configured to sequentially generate the plurality of pulses having the controlled pulse width, when a pulse enable signal is active.

According to one or more example embodiments, a rise time, which refers to a period of time required for a driving voltage to reach a target level, may be controlled such that a voltage between a control terminal and an output terminal of a switching device remains less than or equal to a threshold voltage based on current-voltage characteristics of the switching device. By maintaining the voltage between a control terminal and an output terminal of a switching device less than or equal to the threshold voltage, generation of leakage current between the control terminal and the output terminal may be suppressed and/or prevented. Moreover, noise resulting from the leakage current in a power device may be suppressed and/or removed. Further still, maintaining the voltage between a control terminal and an output terminal of a switching device less than or equal to the threshold voltage may suppress malfunction of the power device due to leakage current and may also reduce power consumption.

According to at least one example embodiment, a control signal is delayed for a delay period based on the current-voltage characteristics of the switching device, and a driving voltage is applied to the control terminal according to the control signal after the delay period. Thus, a rise time of a voltage of the control terminal may increase, and generation of leakage current in the switching device may be suppressed and/or prevented.

A plurality of pulses of which a pulse width of each pulse may be controlled based on the current-voltage characteristics of the switching device are generated, and a driving voltage having a multi-step waveform, in which at least one of a width and a height of each step varies, may be provided based on the plurality of pulses. Accordingly, the rise time of the voltage of the control terminal may increase, and generation of leakage current in the switching device may be suppressed and/or prevented.

BRIEF DESCRIPTION OF THE DRAWINGS

Example embodiments will become apparent and more readily appreciated from the following description of the accompanying drawings of which.

DETAILED DESCRIPTION

Figure 1:
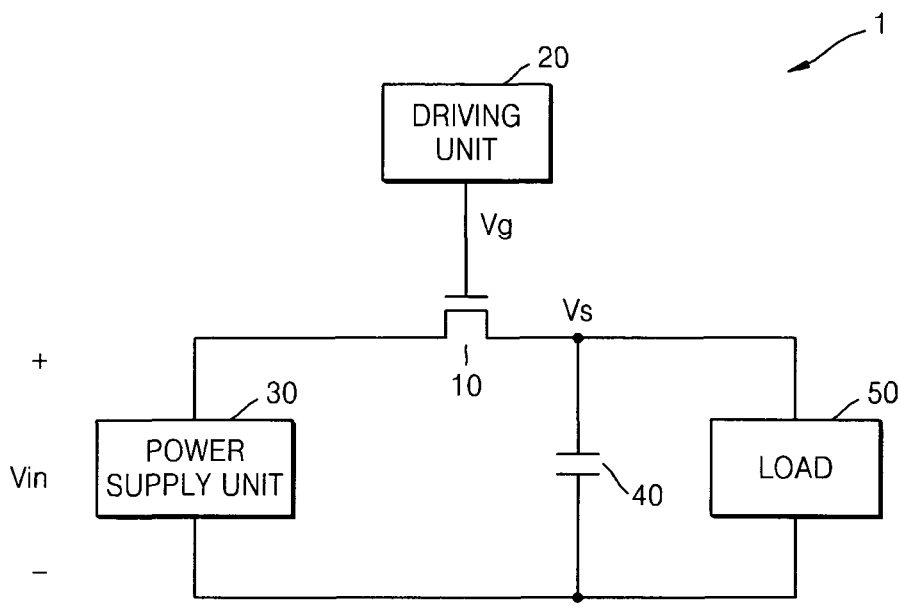
FIG. 1 is a schematic block diagram of a power device according to an example embodiment.

Example embodiments will now be described more fully with reference to the accompanying drawings. In the drawings, the thicknesses of layers and regions are exaggerated for clarity. Like reference numerals in the drawings denote like elements.

Detailed example embodiments are disclosed herein. However, specific structural and functional details disclosed herein are merely representative for purposes of describing example embodiments. Example embodiments may, however, may be embodied in many alternate forms and should not be construed as limited to only the example embodiments set forth herein.

It should be understood, however, that there is no intent to be limited to the particular example embodiments disclosed, but on the contrary example embodiments are to cover all modifications, equivalents, and alternatives falling within the scope of this disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments are discussed herein as "units." However, example embodiments may also be characterized as "circuits." For example, the driving unit 20 shown in FIG. 1 may be referred to as a "driving circuit 20," the delay unit 21 may be referred to as the "delay circuit 21."

FIG. 1 is a schematic block diagram of a power device 1 according to an example embodiment.

Referring to FIG. 1, the power device 1 includes a switching device 10, a driving unit (or circuit) 20, a power supply unit (or circuit) 30, a capacitor 40, and a load 50. According to at least this example embodiment, the power device 1 is a power circuit configured to provide the load 50 with a power supply voltage Vin from the power supply unit 30 according to an on/off operation of the switching device 10. The power supply voltage Vin may have a relatively high voltage level (e.g., about 10 V to about 1000 V, inclusive). This type of power device 1 may be used in, for example, electric automobiles, general electronic apparatuses, and the like. Although not shown in FIG. 1, the power device 1 may further include at least one diode, at least one resistor, at least one inductor, and/or at least one capacitor. In this example, a boosted voltage or a reduced voltage may be provided to the load 50.

The power supply unit 30 may include a plurality of power supplies serially connected to each other. The plurality of power supplies may be a plurality of solar or photovoltaic cells or a secondary battery.

The switching device 10 is turned on/off by the driving unit 20 to selectively transmit the power supply voltage Vin from the power supply unit 30 to the load 50. In this case, the switching device 10 transmits a smoothened voltage to the load 50 using the capacitor 40. The switching device 10 has a control terminal, an input terminal, and an output terminal. The control terminal is connected to the driving unit 20, the input terminal is connected to the power supply unit 30, and the output terminal is connected to the load 50.

According to at least this example embodiment, the switching device 10 may be a high-voltage transistor having a gate, a drain, and a source and being capable of enduring a relatively high voltage. In this example, the gate corresponds to the control terminal, the drain corresponds to the input terminal, and the source corresponds to the output terminal. In one example, the switching device 10 may be a high electron mobility transistor (HEMT) or heterojunction field effect transistor (HFET) formed of GaN, SiC, or the like. A case where the switching device 10 is a high-voltage transistor will now be described below.

Figure 2:
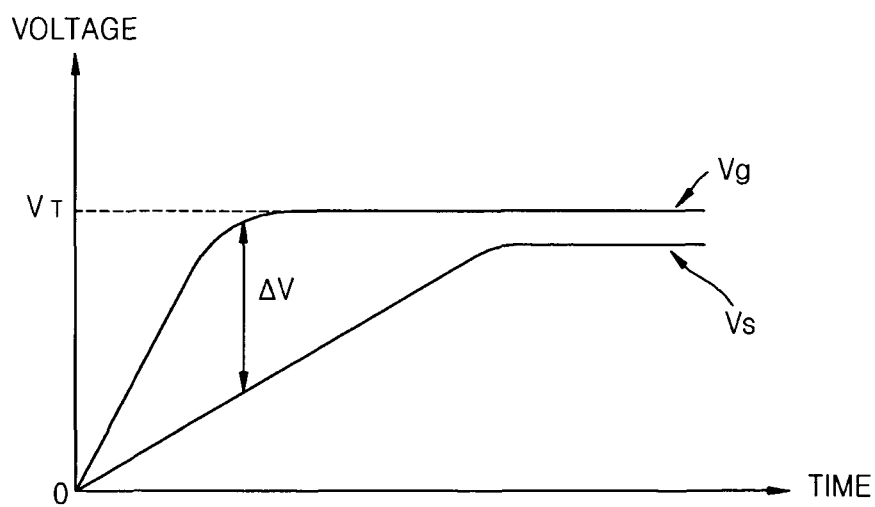
FIG. 2 is a graph of voltage versus time showing a gate voltage and a source voltage of a switching device included in the power device illustrated in FIG. 1 when a driving unit included in the power device illustrated in FIG. 1 does not operate properly.

FIG. 2 is a example graph of voltage versus time showing a gate voltage Vg and a source voltage Vs of the switching device 10 of FIG. 1 when the driving unit 20 of the power device 1 of FIG. 1 does not operate properly.

Referring to FIG. 2, in the switching device 10, as the gate voltage Vg increases, the source voltage Vs also increases. But, the rate of increase of the gate voltage Vg is greater than the rate of increase of the source voltage Vs. In such a case, the rise time of the gate voltage Vg is shorter than the rise time of the source voltage Vs. As a result, the slope or incline of the gate voltage Vg is greater than that of the source voltage Vs.

When the gate voltage Vg reaches a target level $V_T$, the source voltage Vs is at a voltage level less than the target level $V_T$. At this time, the source voltage Vs has a voltage level that is lower than the gate voltage Vg by a threshold voltage. Ultimately, however, the source voltage Vs and the gate voltage Vg of the switching device 10 may reach the same or substantially the same level (e.g., target voltage level $V_T$).

When a difference ΔV (also referred to herein as Vgs) between the gate voltage Vg and the source voltage Vs is greater than a critical voltage $V_{GL}$, leakage current flows between the gate and the source of the switching device 10. The critical voltage $V_{GL}$ is a minimum voltage level at which leakage current is generated between the gate and the source of the switching device 10. Leakage current generated in the switching device 10 may: increase noise in the power device 1; increase the possibility that the power device 1 malfunctions; and/or increase overall power consumption. In one example, the leakage current flowing between the gate and the source may be relatively large when a voltage applied to the switching device 10 is a relatively high voltage.

Figure 3:
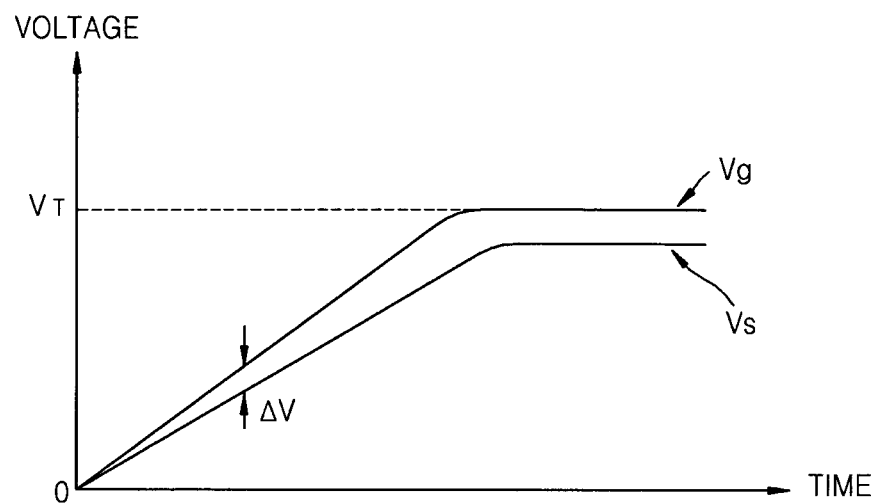
FIG. 3 is a graph of voltage versus time showing a gate voltage and a source voltage of the switching device included in the power device illustrated in FIG. 1 when the driving unit in the power device illustrated in FIG. 1 operates properly.

FIG. 3 is an example graph of voltage versus time showing the gate voltage Vg and the source voltage Vs of the switching device 10 of FIG. 1 when the driving unit 20 of the power device 1 of FIG. 1 operates properly.

Referring to FIGS. 1 and 3, the driving unit 20 generates and applies a driving voltage to the gate of the switching device 10 to control the on/off operation of the switching device 10.

In this example, the driving unit 20 applies the driving voltage to the gate of the switching device 10 so that the voltage difference ΔV between the gate and the source of the switching device 10 remains less than or equal to the critical voltage $V_{GL}$. In at least some example embodiments, the driving unit 20 applies the driving voltage to the gate of the switching device 10 so that the voltage difference ΔV between the gate and the source of the switching device 10 remains less than the critical voltage $V_{GL}$.

According to at least some example embodiments, a period of time required for the driving voltage to reach the target level $V_T$ (hereinafter, referred to as a rise or rising time of the driving voltage) is determined based on current-voltage characteristics of the switching device 10. In one example, the rise time of the driving voltage is determined to increase based on the current-voltage characteristics of the switching device 10.

As a period of time required for the gate voltage Vg to reach the target level $V_T$ (a rise time of the gate voltage Vg) increases, the slope of the gate voltage Vg decreases, and thus, a difference between the incline of the gate voltage Vg and the incline of the source voltage Vs decreases. Accordingly, the voltage Vgs between the gate voltage Vg and the source voltage Vs is less than or equal to the critical voltage $V_{GL}$, and leakage current is not generated between the gate and the source of the switching device 10.

The current-voltage characteristics of the switching device 10 include a variation in the gate voltage Vg with respect to time, a variation in the source voltage Vs with respect to time, a variation in a leakage current flowing between the gate and the source with respect to the voltage Vgs between the gate and the source, a variation in a current between the drain and the source with respect to the voltage between the gate and the source, a variation in a current between the drain and the source with respect to a voltage between the drain and the source, a resistance when the switching device 10 is turned on, and the like.

According to at least this example embodiment, the rise time of the driving voltage is determined based on a variation of the gate voltage Vg with respect to time. In the case switching devices in which the gate voltage Vg increases relatively fast according to time, the rise time of the driving voltage may increase relatively widely. As for switching devices in which the gate voltage Vg increases relatively slowly with time, the rise time of the driving voltage may increase relatively narrowly.

As such, the current-voltage characteristics of the switching device 10 to be used in the power device 1 are analyzed, and the driving voltage provided from the driving unit 20 is previously determined according to a result of the analysis. Thus, while the power device 1 is operating, generation of leakage current between the gate and the source in the switching device 10 may be suppressed and/or prevented. A structure of the driving unit 20 for providing the driving voltage determined based on the current-voltage characteristics of the switching device 10 will now be described in greater detail.

Figure 4:
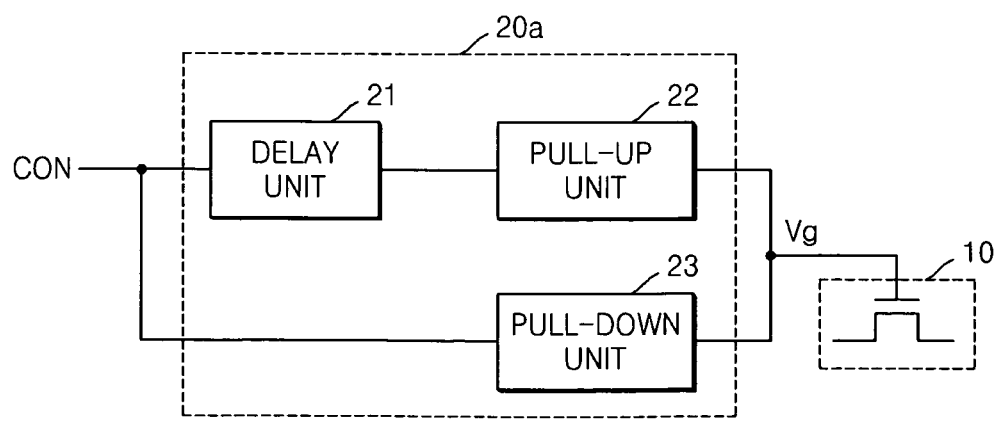
FIG. 4 is a schematic block diagram of a driving unit of the power device illustrated in FIG. 1 according to an example embodiment.

FIG. 4 is a schematic block diagram of an example embodiment of the driving unit 20 shown in FIG. 1.

Referring to FIG. 4, the driving unit 20a includes a delay unit (or circuit) 21, a pull-up unit (or circuit) 22, and a pull-down unit (or circuit) 23. Example operation of the driving unit 20a will now be described in more detail.

The delay unit 21 delays a control signal CON input from an external source for a first delay period (e.g., delay duration) to generate a delayed control signal. The first delay period varies according to the rise time of the driving voltage, which is determined based on the current-voltage characteristics of the switching device 10. According to an example embodiment, the control signal CON may be a pulse signal that is activated during a time period in which the switching device 10 is desired to be turned on. According to another example embodiment, the control signal CON may be a clock signal having a given, desired or predetermined period.

The pull-up unit 22 applies a power supply voltage to the gate of the switching device 10 according to the delayed control signal output from the delay unit 21. In more detail, the pull-up unit 22 applies the power supply voltage to the gate of the switching device 10 when the delayed control signal is activated, thereby increasing the gate voltage Vg of the switching device 10.

The pull-down unit 23 applies a ground voltage to the gate of the switching device 10 according to the control signal CON. In more detail, the pull-down unit 23 applies the ground voltage to the gate of the switching device 10 when the control signal CON is not activated, thereby turning off the switching device 10.

As such, the driving unit 20a provides the power supply voltage to the gate of the switching device 10 after the first delay period by delaying the control signal CON for the first delay period according to the rise time of the driving voltage, which is determined based on the current-voltage characteristics of the switching device 10. Thus, even when the control signal CON is unchanged, the gate voltage Vg increases relatively slowly and the rise time of the gate voltage Vg increases.

Figure 5:
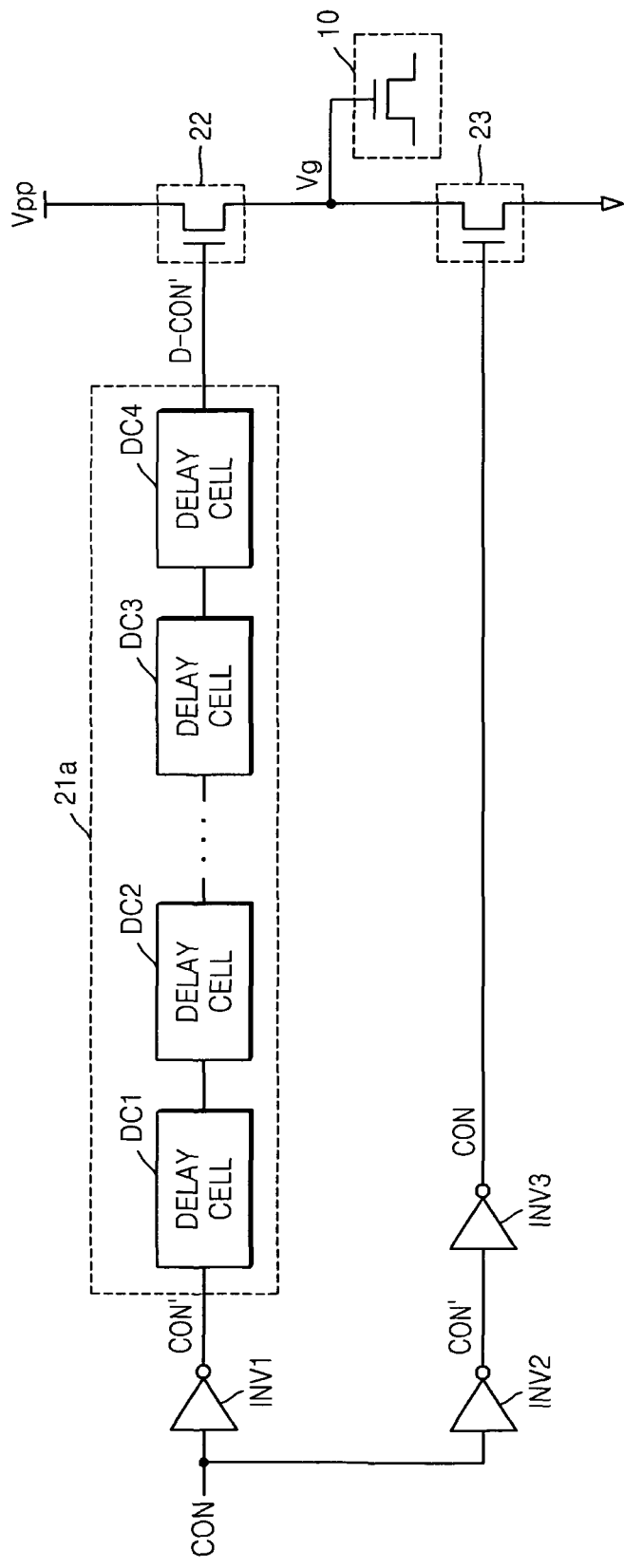
FIG. 5 is a schematic circuit diagram of an example embodiment of the driving unit of FIG. 4.

FIG. 5 is a schematic circuit diagram of an example embodiment of the driving unit 20a shown in FIG. 4.

Referring to FIG. 5, the driving unit includes a delay unit (or circuit) 21a, a pull-up unit (or circuit) 22, a pull-down unit (or circuit) 23, and first through third inverters INV1 through INV3. According to at least this example embodiment, the driving unit includes three inverters INV1 through INV3, but the number of inverters is not limited thereto. According to another example embodiment, the number of inverters included in the driving unit may be changed. For example, three inverters may be connected in front of the delay unit 21a, and five inverters may be connected in front of the pull-down unit 23.

The first inverter INV1 inverts the control signal CON to output an inverted control signal CON'. The second inverter INV2 also inverts the control signal CON to output the inverted control signal CON', and the third inverter INV3 inverts the inverted control signal CON' to restore the control signal CON. The control signal CON may be a pulse signal that is logic '0' during a time period in which the switching device 10 is intended to be turned on, but is logic '1' during a time period in which the switching device 10 is intended to be turned off. However, example embodiments are not limited thereto. According to at least one other example embodiment, the control signal CON may be a pulse signal that is logic '1' during a time period in which the switching device 10 is intended to be turned on, but is logic '0' during a time period in which the switching device 10 is intended to be turned off.

Still referring to FIG. 5, the delay unit 21a delays the inverted control signal CON' output from the first inverter INV1 to output a delayed inverted control signal D-CON'. In more detail, the delay unit 21a includes a plurality of delay cells DC1 through DC4 serially connected to one another. Each of the delay cells DC1 through DC4 delays an input signal for a unit time period (also referred to as a unit delay duration). According to at least one example embodiment, the unit delay period may correspond to a portion of the first delay period discussed above.

The delay unit 21a shown in FIG. 5 includes four delay cells DC1 through DC4, but the number of delay cells included in the delay unit 21a is not limited thereto. According to at least one other example embodiment, the number of delay cells included in the delay unit 21a may be changed.

The pull-up unit 22 includes a pull-up transistor 22 that is turned on/off according to the delayed inverted control signal D-CON' output from the delay unit 21a. The pull-up transistor 22 may be an NMOS transistor. In this case, the pull-up transistor 22 is turned on and applies a power supply voltage $V_{PP}$ to the gate of the switching device 10 when the delayed inverted control signal D-CON' is logic '1'. The pull-up transistor 22 is turned off and does not apply the power supply voltage $V_{PP}$ to the gate of the switching device 10 when the delayed inverted control signal D-CON' is logic '0'. According to at least one other example embodiment, the pull-up unit 22 may include a plurality of transistors and/or the pull-up unit 22 may be a PMOS transistor.

Still referring to FIG. 5, the pull-down unit 23 includes a pull-down transistor 23 that is turned on/off according to the control signal CON output from the third inverter INV3. The pull-down transistor 23 may be an NMOS transistor. In this case, the pull-down transistor 23 is turned on and applies a ground voltage to the gate of the switching device 10 when the control signal CON is logic '1'. The pull-down transistor 23 is turned off and does not apply the ground voltage to the gate of the switching device 10 when the control signal CON is logic '0'. According to at least one other example embodiment, the pull-down unit 23 may include a plurality of transistors and/or the pull-down unit 23 may be a PMOS transistor.

If the driving unit does not include the delay unit 21a, when the inverted control signal CON' is activated, the pull-up unit 22 immediately applies the power supply voltage $V_{PP}$ to the gate of the switching device 10. Thus, the gate voltage Vg of the switching device 10 increases relatively quickly and leakage current may be generated between the gate and the source of the switching device 10.

However, according to at least this example embodiment, because the delay unit 21a delays the inverted control signal CON' for the first delay period when the inverted control signal CON' is activated, the pull-up unit 22 applies the power supply voltage $V_{PP}$ to the gate of the switching device 10 after the first delay period. Accordingly, the gate voltage Vg of the switching device 10 increases relatively slowly, and generation of leakage current between the gate and the source of the switching device 10 may be suppressed and/or prevented.

Figure 6:
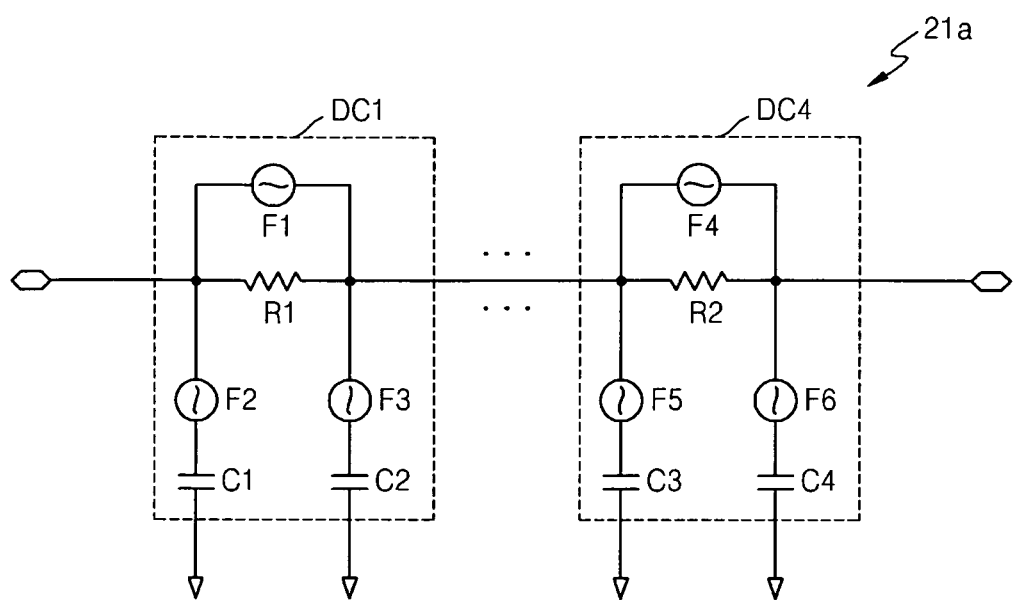
FIG. 6 is a detailed circuit diagram of an example embodiment of the delay unit of the driving unit of FIG. 5.

FIG. 6 is a detailed circuit diagram of an example embodiment of the delay unit 21a shown in FIG. 5.

Referring to FIG. 6, the delay unit 21a includes a plurality of delay cells DC1 and DC4. Although only first and fourth delay cells DC1 and DC4 are illustrated in FIG. 6 for convenience of explanation, the number of delay cells included in the delay unit 21a is not limited thereto.

The first delay cell DC1 includes a first resistor R1, first and second capacitors C1 and C2, and first through third fuses F1 through F3. The first fuse F1 is connected in parallel with the first resistor R1. The second fuse F2 is serially connected to the first capacitor C1. The third fuse F3 is serially connected to the second capacitor C2.

The fourth delay cell DC4 includes a second resistor R2, third and fourth capacitors C3 and C4, and fourth through sixth fuses F4 through F6. The fourth fuse F4 is connected in parallel with the second resistor R2. The fifth fuse F5 is serially connected to the third capacitor C3. The fourth fuse F4 is serially connected to the fourth capacitor C4. Example embodiments are not limited to the specific arrangement shown in FIG. 6. According to at least one other example embodiment, each delay cell may be an inverter, a buffer, or the like.

According to at least this example embodiment, the first through sixth fuses F1 through F6 may be laser fuses configured to be cut using a laser. In this case, some of the first through sixth fuses F1 through F6 may be cut based on the current-voltage characteristics of the switching device 10, and some of the delay cells DC1 and DC4 may be activated in response to the cutting of the some of the first through sixth fuses F1 through F6. Because each of the delay cells DC1 and DC4 delays an input signal for a unit delay period, the first delay period may be controlled by the activation of the some of the delay cells DC1 and DC4.

In one example, the first delay cell DC1 is activated when the first fuse F1 is cut, but the second and third fuses F2 and F3 are not cut. As a result, the first delay cell DC1 delays the inverted control signal CON' for the unit delay period. On the other hand, when the first fuse F1 is not cut, but the second and third fuses F2 and F3 are cut, the first delay cell DC1 is not activated. In this case, the first delay cell DC1 does not delay the inverted control signal CON'. Due to this control of the fuses included in each delay cell, only some of a plurality of delay cells may be activated. Thus, the first delay period of the delay unit 21a may be proportional to the number of activated delay cells.

Figure 7:
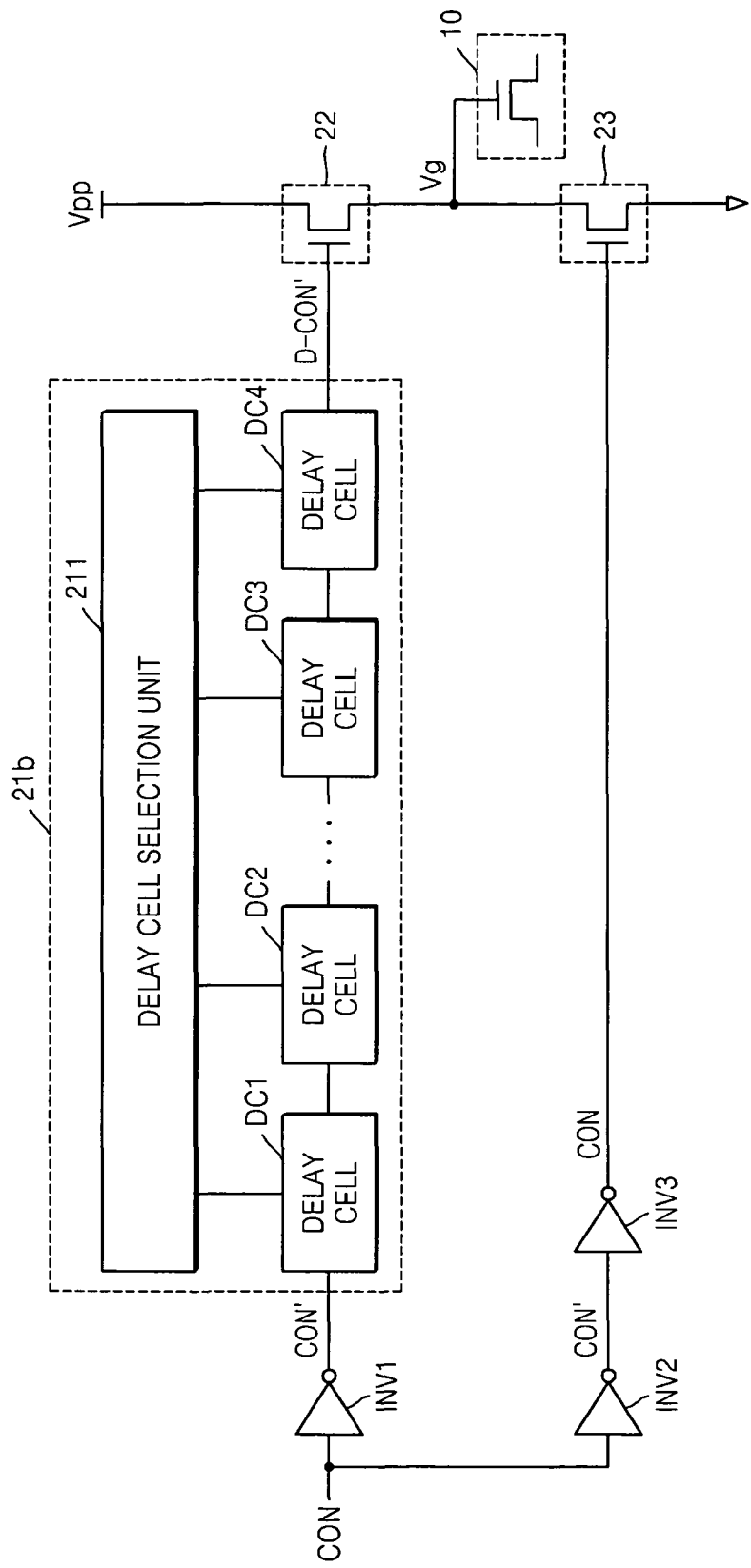
FIG. 7 is a schematic circuit diagram of another example embodiment of the driving unit of FIG. 4.

FIG. 7 is a schematic circuit diagram of another example embodiment of the driving unit 20a shown in FIG. 4.

Referring to FIG. 7, the driving unit 20a includes a delay unit (or circuit) 21b, a pull-up unit (or circuit) 22, a pull-down unit (or circuit) 23, and first through third inverters INV1 through INV3. Because the driving unit of FIG. 7 is similar to the driving unit shown in FIG. 5, duplicated description of portions thereof will be omitted. The driving unit of FIG. 7 will now be described by focusing on differences between the driving unit of FIG. 7 and the driving unit of FIG. 5.

In the example embodiment shown in FIG. 7, the delay unit 21b delays the inverted control signal CON' output from the first inverter INV1 for a second delay period to generate the delayed inverted control signal D-CON'. As shown in FIG. 7, the delay unit 21b includes delay cells DC1 through DC4 serially connected to one another. The delay unit 21b also includes a delay cell selection unit 211.

The delay cell selection unit 211 applies a selection signal for selecting some of the delay cells DC1 through DC4 based on the rise time determined according to the current-voltage characteristics of the switching device 10.

According to at least this example embodiment, the delay cell selection unit 211 may be a fuse circuit including a plurality of E-fuses. The E-fuses may be implemented by using non-volatile memory devices, latches, or the like. According to at least one other example embodiment, the delay cell selection unit 211 may be implemented by using a mode register set (MRS).

Figure 8:
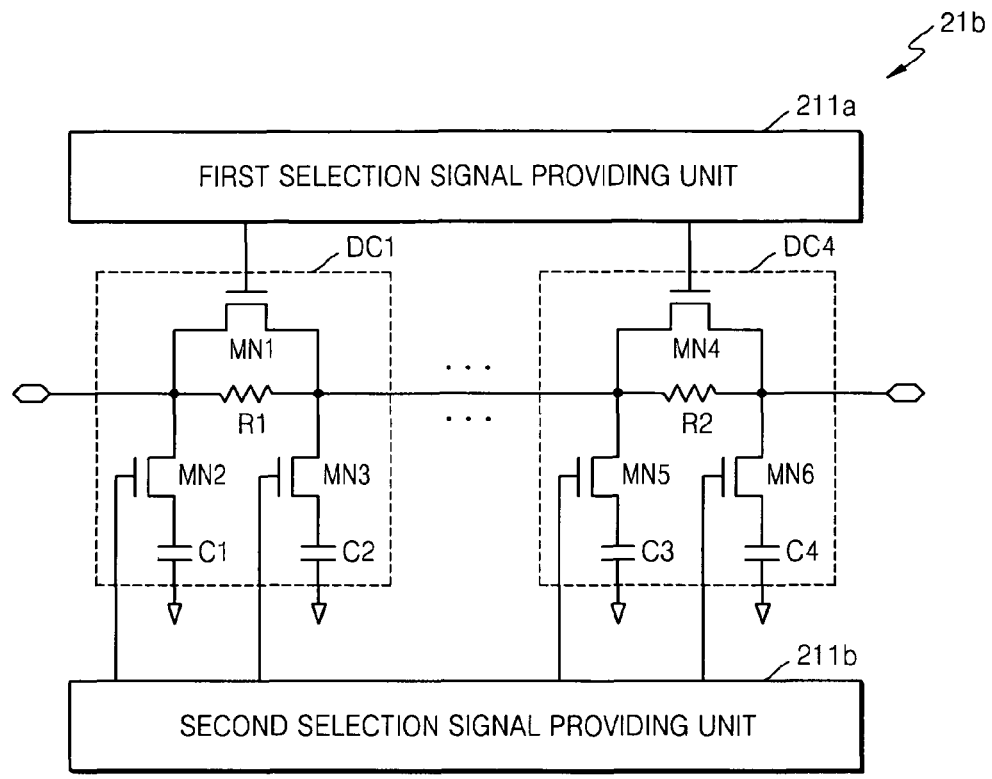
FIG. 8 is a detailed circuit diagram of an example embodiment of the delay unit of the driving unit of FIG. 7.

FIG. 8 is a more detailed circuit diagram of an example embodiment of the delay unit 21b shown in FIG. 7.

Referring to FIG. 8, the delay unit 21b includes the first and second delay cells DC1 and DC4 and first and second selection signal providing units (or circuits) 211a and 211b. In this example, the first and second selection signal providing units 211a and 211b constitute the selection signal providing unit 211 shown in FIG. 7. Although only the first and second delay cells DC1 and DC4 are illustrated in FIG. 8 for convenience of explanation, the number of delay cells included in the delay unit 21b is not limited thereto.

The first delay cell DC1 includes a first resistor R1, first and second capacitors C1 and C2, a first resistor switch MN1, and first and second capacitor switches MN2 and MN3. The first resistor switch MN1 is connected in parallel with the first resistor R1. The first capacitor switch MN2 is serially connected to the first capacitor C1. The second capacitor switch MN3 is serially connected to the second capacitor C2. The fourth delay cell DC4 includes the second resistor R2, third and fourth capacitors C3 and C4, a second resistor switch MN4, and third and fourth capacitor switches MN5 and MN6. The second resistor switch MN4 is connected in parallel with the second resistor R2. The third capacitor switch MN5 is serially connected to the third capacitor C3. The fourth capacitor switch MN6 is serially connected to the fourth capacitor C4. However, example embodiments are not limited thereto. According to at least one other example embodiment, each delay cell may be an inverter, a buffer, or the like.

The first selection signal providing unit 211a applies resistor selection signals that turn on/off the resistor switches included in each delay cell. In more detail, the first selection signal providing unit 211a applies a first resistor selection signal to the first resistor switch MN1 included in the first delay cell DC1, and applies a second resistor selection signal to the second resistorswitch MN4 included in the fourth delay cell DC4.

The second selection signal providing unit 211b applies capacitor selection signals that turn on/off the capacitor switches included in each delay cell. In more detail, the second selection signal providing unit 211b applies first and second capacitor selection signals to the first and second capacitors C1 and C2, respectively, included in the first delay cell DC1, and applies third and fourth capacitor selection signals to the third and fourth capacitors C3 and C4, respectively, included in the fourth delay cell DC4.

An example in which the first and second selection signal providing units 211a and 211b select the first delay cell DC1, but do not select the fourth delay cell DC4, will now be described in more detail.

The first selection signal providing unit 211a applies the first and second resistor selection signals. If the first resistor selection signal is logic '0' and the second resistor selection signal is logic '1', the first resistor switch MN1 is turned off and the second resistor switch MN2 is turned on. As a result, the first resistor R1 is selected and the second resistor R2 is not selected.

The second selection signal providing unit 211b provides the first through fourth capacitor selection signals. If the first and second capacitor selection signals are logic '1', but the third and fourth capacitor selection signals are logic '0', the first and second capacitor switches MN2 and MN3 are turned on whereas the third and fourth capacitor switches MN5 and MN6 are turned off. As a result, the first and second capacitors C1 and C2 are selected and the third and fourth capacitors C3 and C4 are not selected.

In this example, the delay unit 21b delays the received inverted control signal CON' for a unit delay period generated in the first delay cell DC1 to output the delayed inverted control signal D-CON'. Thus, the pull-up unit 22 is turned on after a second delay period corresponding to the unit delay period, so that the gate voltage Vg of the switching device 10 increases relatively slowly.

In another example, when the first and fourth delay cells DC1 and DC4 included in the delay unit 21b are selected, the delay unit 21b delays the received inverted control signal CON' for a second delay period generated by the first and fourth delay cells DC1 and DC4 to output the delayed inverted control signal D-CON'. Accordingly, the pull-up unit 22 turns on after a delay period corresponding to two unit delay periods so that the gate voltage Vg of the switching device 10 increases more slowly.

Figure 9:
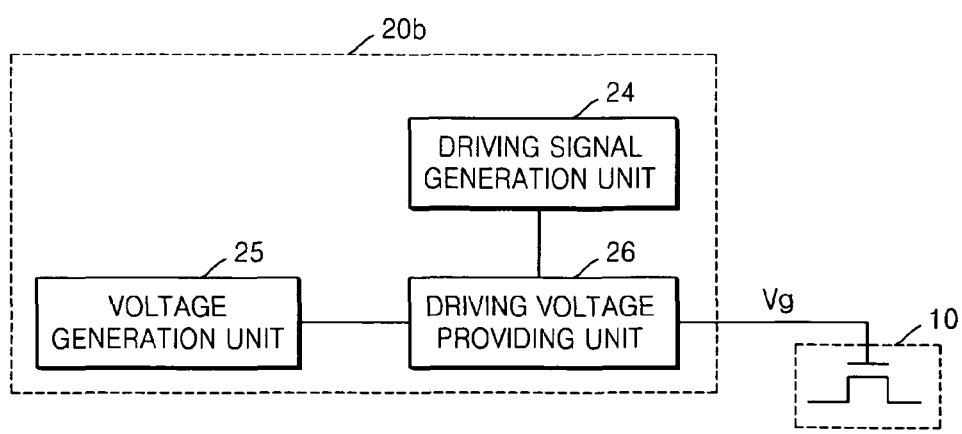
FIG. 9 is a schematic block diagram of another example embodiment of a driving unit of the power device illustrated in FIG. 1.

FIG. 9 is a schematic block diagram of another example embodiment of a driving unit 20 of the power device 1 illustrated in FIG. 1.

Referring to FIG. 9, the driving unit 20b includes a driving signal generation unit (or circuit) 24, a voltage generation unit (or circuit) 25, and a driving voltage providing unit (or circuit) 26. An example operation of the driving unit 20b will now be described in more detail.

The driving signal generation unit 24 generates a driving signal including a plurality of pulses that are sequentially turned on/off. A width of each of the pulses may be determined according to the current-voltage characteristics of the switching device 10. The voltage generation unit 25 may include a plurality of voltage generation units (not shown). In this example, the voltage generation unit 25 generates a plurality of voltages having different levels. The driving voltage providing unit 26 provides one of the plurality of voltages generated by the voltage generation unit 25 to the gate of the switching device 10, according to the driving signal generated by the driving signal generation unit 24. In this example, the driving voltage provided by the driving voltage providing unit 26 has a multi-step waveform in which at least one selected from the group including a width and a height of each step varies based on the pulses included in the driving signal.

As such, the driving unit 20b determines a point in time when a voltage corresponding to the next level (e.g., the next step with respect to the current step in the driving voltage having the multi-step waveform) is applied based on a plurality of pulses having the pulse widths determined according to the current-voltage characteristics of the switching device 10. Thus, the rise time (the increasing incline) of the gate voltage Vg may be controlled, and thus, generation of leakage current between the gate and the source of the switching device 10 may be suppressed and/or prevented.

Figure 10:
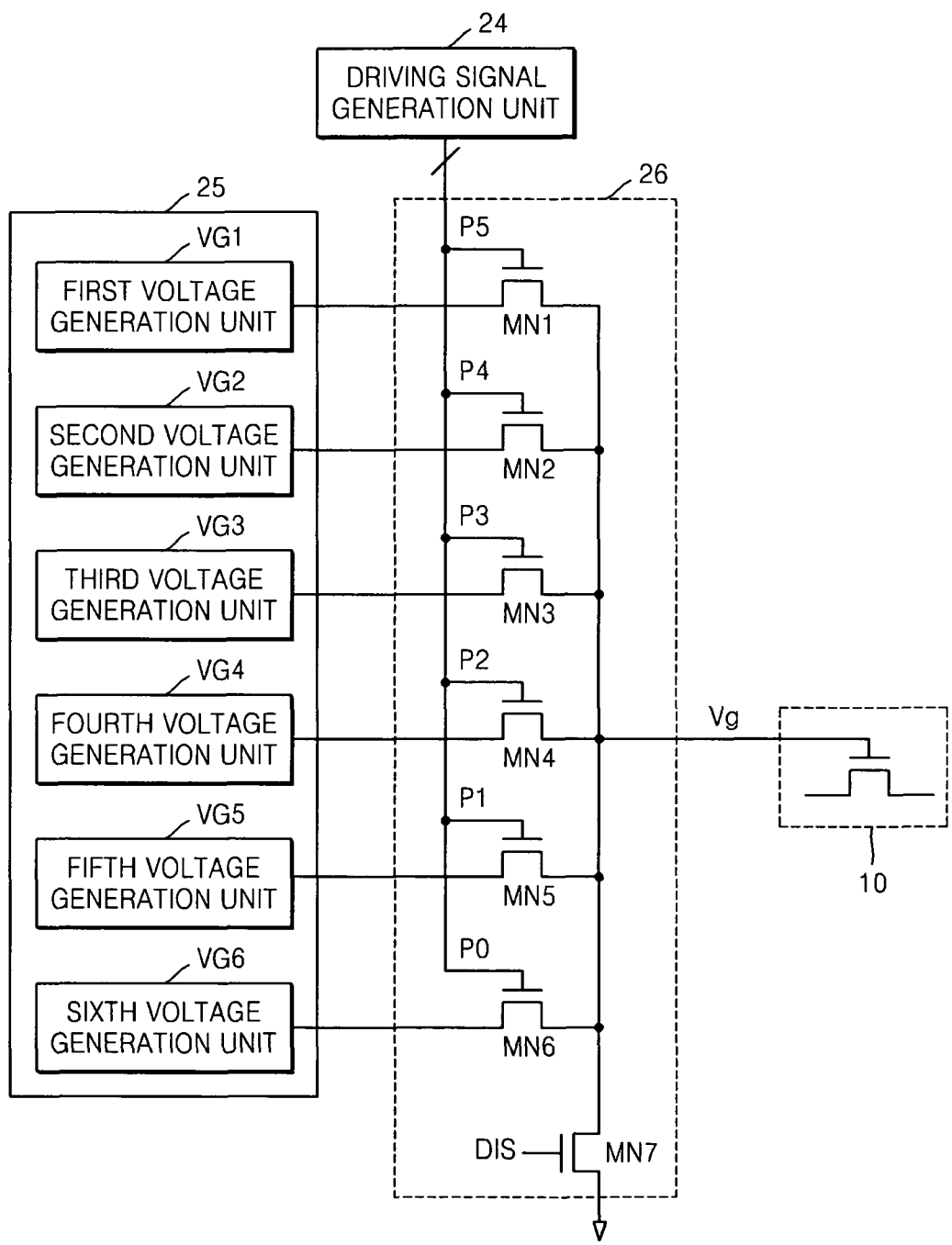
FIG. 10 is a more detailed schematic block diagram of an example embodiment of the driving unit shown in FIG. 9.

FIG. 10 is a schematic circuit diagram of an example embodiment of the driving unit 20b shown in FIG. 9.

Referring to FIG. 10, the driving signal generation unit 24 generates a driving signal determined according to the current-voltage characteristics of the switching device 10. The driving signal may be an N-bit pulse signal (P<0:(N−1)>). For example, the driving signal may be a 6-bit pulse signal (P<0:5>) including first through sixth pulses P0 through P5. However, this is just an example, and the driving signal may be a pulse signal having any suitable number of bits, the number of which may vary.

In the example embodiment shown in FIG. 10, the voltage generation unit 25 includes first through sixth voltage generation units VG1 through VG6. The first through sixth voltage generation units VG1 through VG6 generate first through sixth voltages V1 through V6, respectively. The first through sixth voltages V1 through V6 may have different values. For example, the first voltage V1 may be about 300 V, the second voltage V2 may be about 250 V, the third voltage V3 may be about 200 V, the fourth voltage V4 may be about 150 V, the fifth voltage V5 may be about 100 V, and the sixth voltage V6 may be about 50 V.

The driving voltage providing unit 26 includes first through seventh transistors (e.g., NMOS transistors) MN1 through MN7. Each of the gates of the first through sixth NMOS transistors MN1 through MN6 receive a respective pulse signal. In more detail, the gate of the first NMOS transistor MN1 receives the sixth pulse P5, the gate of the second NMOS transistor MN2 receives the fifth pulse P4, the gate of the third NMOS transistor MN3 receives the fourth pulse P3, the gate of the fourth NMOS transistor MN4 receives the third pulse P2, the gate of the fifth NMOS transistor MN5 receives the second pulse P1, and the gate of the sixth NMOS transistor MN6 receives the first pulse P0. Drains of the first through sixth NMOS transistors MN1 through MN6 are connected to the first through sixth voltage generation units VG1 through VG6, respectively, to receive the first through sixth voltage V1 through V6, respectively. Sources of the first through sixth NMOS transistors MN1 through MN6 are commonly connected to the gate of the switching device 10. The seventh NMOS transistor MN7 has a drain connected to the gate of the switching device 10 and a source connected to a ground terminal. A discharge signal DIS is applied to the gate of the seventh NMOS transistor MN7. The seventh NMOS transistor MN7 is turned on when the discharge signal DIS is enabled, thereby providing a ground voltage to the gate of the switching device 10.

Figure 11:
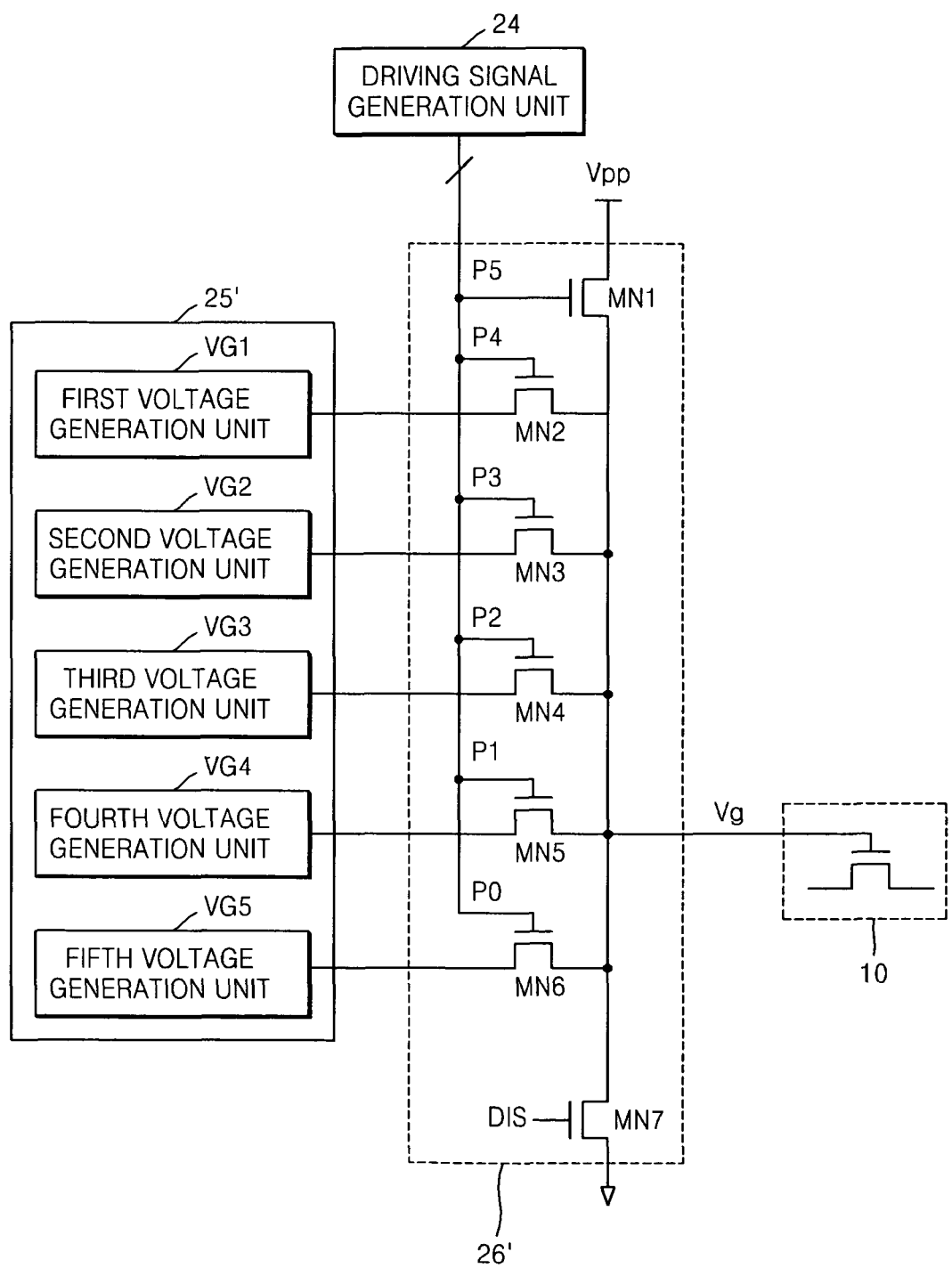
FIG. 11 is a more detailed schematic block diagram of another example embodiment of the driving unit shown in FIG. 9.

FIG. 11 is a schematic circuit diagram of another example embodiment of the driving unit 20b shown in FIG. 9.

Referring to FIG. 11, the driving signal generation unit 24 generates a driving signal determined according to the current-voltage characteristics of the switching device 10. In this example, the driving signal may also be an N-bit pulse signal (P<0:(N−1)>). For example, the driving signal may be a 6-bit pulse signal (P<0:5>) including first through sixth pulses P0 through P5. However, this is just an example, and the driving signal may be a pulse signal having any suitable number of bits, the number of which may vary.

In the example embodiment shown in FIG. 11, the voltage generation unit 25' includes first through fifth voltage generation units VG1 through VG5, which generate first through fifth voltages V1 through V5, respectively. The first through fifth voltages V1 through V5 may have different values. For example, the first voltage V1 may be about 250 V, the second voltage V2 may be about 200 V, the third voltage V3 may be about 150 V, the fourth voltage V4 may be about 100 V, and the fifth voltage V5 may be about 50 V.

A driving voltage providing unit 26' includes first through seventh NMOS transistors MN1 through MN7. Gates of the first through sixth NMOS transistors MN1 through MN6 are configured to receive a pulse signal. In more detail, the gate of the first NMOS transistor MN1 receives the sixth pulse P5, the gate of the second NMOS transistor MN2 receives the fifth pulse P4, the gate of the third NMOS transistor MN3 receives the fourth pulse P3, the gate of the fourth NMOS transistor MN4 receives the third pulse P2, the gate of the fifth NMOS transistor MN5 receives the second pulse P1, and the gate of the sixth NMOS transistor MN6 receives the first pulse P0. A drain of the first NMOS transistor MN1 receives the power supply voltage $V_{PP}$, and drains of the second through sixth NMOS transistors MN2 through MN6 are connected to the first through fifth voltage generation units VG1 through VG5, respectively, to receive the first through fifth voltage V1 through V5, respectively. Sources of the first through sixth NMOS transistors MN1 through MN6 are commonly connected to the gate of the switching device 10. The power supply voltage $V_{PP}$ may have a voltage level higher than the first voltage V1. The seventh NMOS transistor MN7 has a drain connected to the gate of the switching device 10 and a source connected to a ground terminal. A discharge signal DIS is applied to the gate of the seventh NMOS transistor MN7. The seventh NMOS transistor MN7 is turned on when the discharge signal DIS is enabled, thereby providing a ground voltage to the gate of the switching device 10.

Figure 12:
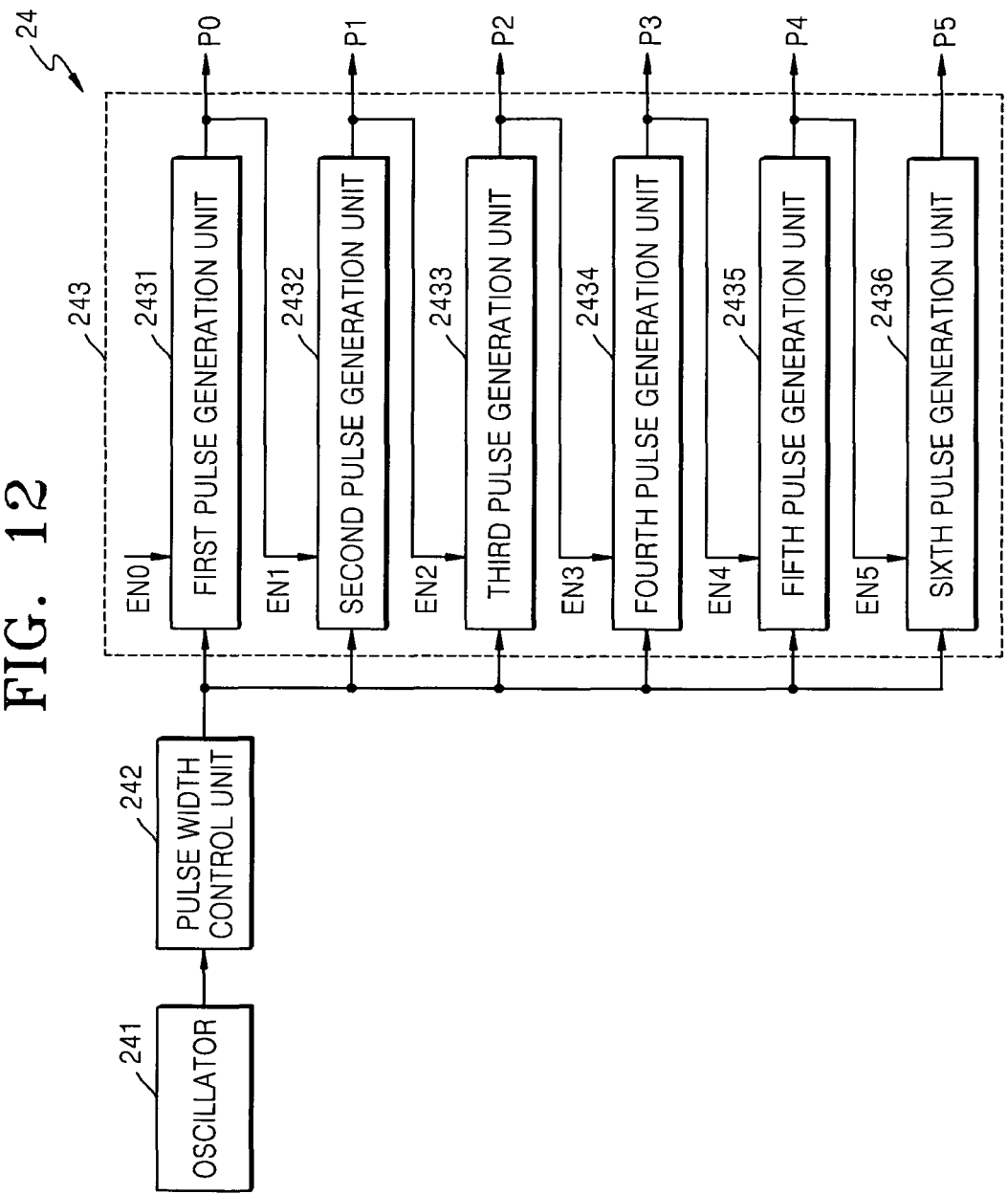
FIG. 12 is a circuit diagram of an example embodiment of the driving signal generation unit of the driving unit shown in FIG. 9.

FIG. 12 is a circuit diagram of an example embodiment of the driving signal generation unit 24 shown in FIG. 9.

Referring to FIG. 12, the driving signal generation unit 24 includes an oscillator (or circuit) 241, a pulse width control unit (or circuit) 242, and a pulse generation unit (or circuit) 243. An example operation of the driving signal generation unit 24 will now be described in more detail.

The oscillator 241 generates a clock signal having a given, desired or predetermined period. The pulse width control unit 242 controls a pulse width of the clock signal generated by the oscillator 241 based on the current-voltage characteristics of the switching device 10. According to at least one example embodiment, the pulse width control unit 242 includes a fuse circuit (not shown) and a counter (not shown). The fuse circuit includes a plurality of fuses. Some of the fuses may be cut based on the current-voltage characteristics of the switching device 10. The counter counts the pulses of the clock signal according to a value set by the fuse circuit, thereby controlling the pulse width of the clock signal. However, a structure of the pulse width control unit 242 is not limited thereto.

When a pulse enable signal is activated, the pulse generation unit 243 sequentially generates a plurality of pulses having pulse widths controlled by the pulse width control unit 242. For example, the pulse generation unit 243 may generate the 6-bit pulse signal (P<0:5>) as the driving signal. In this example, 6-bit pulse signal includes first through sixth pulses P0 through P5.

The pulse generation unit 243 shown in FIG. 12 includes first through sixth pulse generation units 2431 through 2436.

When a first enable signal EN0 is activated, the first pulse generation unit 2431 generates the first pulse P0 having a pulse width controlled by the pulse width control unit 242 and provides the first pulse P0 as a second enable signal EN1 to the second pulse generation unit 2432.

When the second enable signal EN1 is activated, the second pulse generation unit 2432 generates the second pulse P1 having a pulse width controlled by the pulse width control unit 242 and provides the second pulse P1 as a third enable signal EN2 to the third pulse generation unit 2433.

When the third enable signal EN2 is activated, the third pulse generation unit 2433 generates the third pulse P2 having a pulse width controlled by the pulse width control unit 242 and provides the third pulse P2 as a fourth enable signal EN3 to the fourth pulse generation unit 2434.

When the fourth enable signal EN3 is activated, the fourth pulse generation unit 2434 generates the fourth pulse P3 having a pulse width controlled by the pulse width control unit 242 and provides the fourth pulse P3 as a fifth enable signal EN4 to the fifth pulse generation unit 2435.

When the fifth enable signal EN4 is activated, the fifth pulse generation unit 2435 generates the fifth pulse P4 having a pulse width controlled by the pulse width control unit 242 and provides the fifth pulse P4 as a sixth enable signal EN5 to the sixth pulse generation unit 2436.

When the sixth enable signal EN5 is activated, the sixth pulse generation unit 2436 generates the sixth pulse P5 having a pulse width controlled by the pulse width control unit 242.

Figure 13:
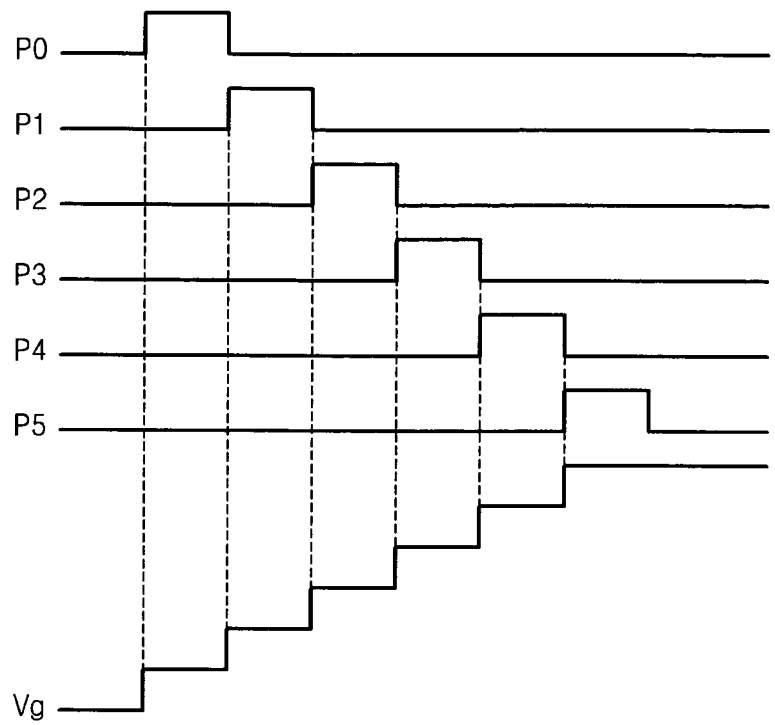
FIG. 13 is an example timing diagram of a driving signal and a gate voltage in the driving unit of FIG. 9 according to an example embodiment.

FIG. 13 is an example timing diagram of a driving signal and a gate voltage in the example embodiment of the driving unit shown in FIG. 9.

Referring to FIG. 13, the rise time of the gate voltage Vg is relatively long, according to the current-voltage characteristics of the switching device 10. In this case, the control signal generation unit 24 controls the pulse width of each of the first through sixth pulses P0 through P5 included in the control signal to be relatively wide. Thus, a width of each step in the gate voltage Vg is relatively wide. According to at least this example embodiment, the width of each step of the gate voltage Vg corresponds to the pulse width of one of the first through sixth pulses P0 through P5.

Figure 14:
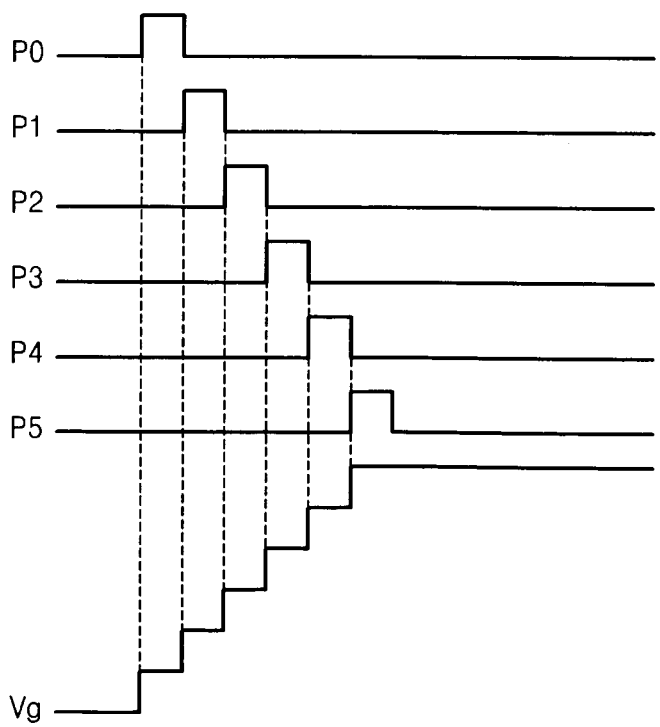
FIG. 14 is an example timing diagram of a driving signal and a gate voltage in the driving unit of FIG. 9 according to another example embodiment.

FIG. 14 is another example timing diagram of a driving signal and a gate voltage in the example embodiment of the driving unit shown in FIG. 9.

Referring to FIG. 14, the rise time of the gate voltage Vg is relatively short, according to the current-voltage characteristics of the switching device 10. In this case, the control signal generation unit 24 controls the pulse width of each of the first through sixth pulses P0 through P5 included in the control signal to be relatively narrow. Thus, the width of each step in the gate voltage Vg is relatively narrow. According to at least this example embodiment, the width of each step of the gate voltage Vg corresponds to the pulse width of one of the first through sixth pulses P0 through P5.

According to at least some example embodiments, the control signal generation unit 24 determines the width of each step in the gate voltage Vg having a multi-step waveform according to the current-voltage characteristics of the switching device 10. The voltage generation unit 25 determines the height of each step in the gate voltage Vg by changing the levels of generated voltages. Thus, the rise time of the gate voltage Vg of the switching device 10 is determined according to the current-voltage characteristics of the switching device 10, and the gate voltage Vg of the switching device 10 is realized as a multi-step waveform in which a voltage level increases in stages.

Figure 15:
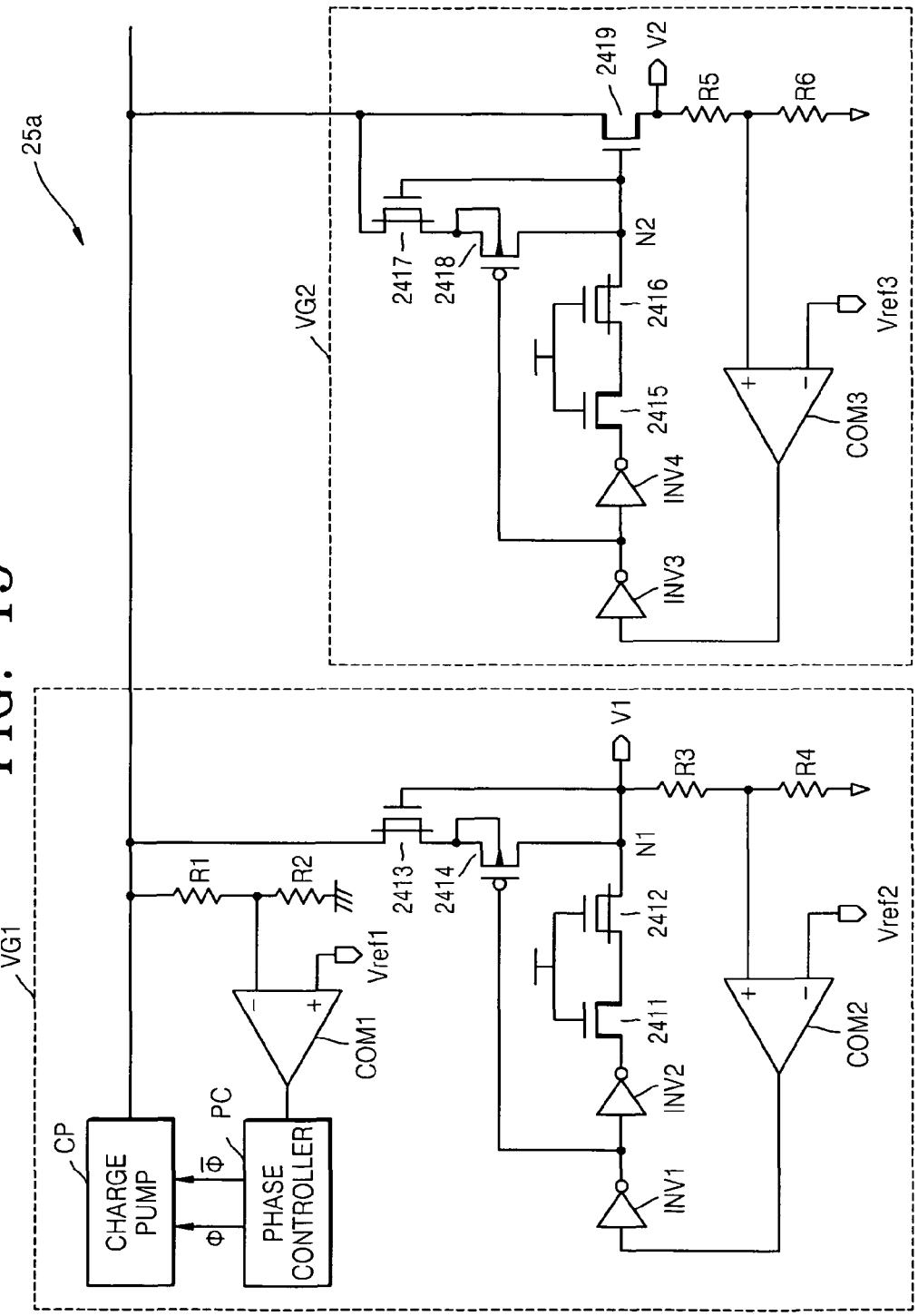
FIG. 15 is a circuit diagram of an example embodiment of the voltage generation unit of the driving unit of FIG. 9.

FIG. 15 is a circuit diagram of an example embodiment of the voltage generation unit 25 shown in FIG. 9.

Referring to FIG. 15, although the voltage generation unit 25a includes first through sixth voltage generation units (or circuits) VG1 through VG6, only the first and second voltage generation units VG1 and VG2 are illustrated for convenience of explanation. The third through sixth voltage generation units VG3 through VG6 may be implemented similarly to the second voltage generation unit VG2. A structure of the voltage generation unit 25a described below is only an example embodiment. The structure of the voltage generation unit 25a is not limited thereto.

The first voltage generation unit VG1 includes a charge pump CP, a phase controller PC, first and second comparators COM1 and COM2, first through fourth resistors R1 through R4, first and second inverters INV1 and INV2, first through third NMOS transistors 2411, 2412, and 2413, and a first PMOS transistor 2414. The first NMOS transistor 2411 may be a high voltage NMOS transistor, whereas the second and third NMOS transistors 2412 and 2413 may be depletion-mode NMOS transistors.

The power supply voltage $V_{PP}$ is distributed according to the values of the first and second resistors R1 and R2. The first comparator COM1 compares a voltage at the second resistor R2 with a first reference voltage Vref1 to generate a first comparison signal. In more detail, the first comparator COM1 generates a negative first comparison signal when the voltage at the second resistor R2 is greater than the first reference voltage Vref1, but generates a positive first comparison signal when the voltage at the second resistor R2 is less than the first reference voltage Vref1.

The phase controller PC outputs a control phase Φ or an inverted control phase Φ' based on the first comparison signal. In more detail, the phase controller PC increases a duration during which the charge pump CP is enabled in response to the positive first comparison signal is received, but decreases the duration during which the charge pump CP is enabled in response to the negative first comparison signal is received.

The charge pump CP generates the power supply voltage $V_{PP}$ based on the phase Φ or the inverted control phase Φ'. In more detail, when the duration during which the charge pump CP is enabled increases, the voltage level of the power supply voltage $V_{PP}$ increases. When the duration during which the charge pump CP is enabled decreases, the voltage level of the power supply voltage $V_{PP}$ decreases.

A first voltage V1 is distributed according to the values of the third and fourth resistors R3 and R4. The second comparator COM2 compares a voltage at the fourth resistor R4 with a second reference voltage Vref2 to generate a second comparison signal. In more detail, the second comparator COM2 generates a negative second comparison signal when the voltage at the fourth resistor R4 is greater than the second reference voltage Vref2, but generates a positive second comparison signal when the voltage at the fourth resistor R4 is less than the second reference voltage Vref2.

The first inverter INV1 inverts the second comparison signal to generate an inverted second comparison signal, and the second inverter INV2 inverts an output of the first inverter INV1 to restore the second comparison signal. The first PMOS transistor 2414 is turned on/off according to the output of the first inverter INV1 to provide the power supply voltage $V_{PP}$ to a first node N1. A voltage of the first node N1 is the first voltage V1. In this case, the first and second inverters INV1 and INV2 and the second comparator COM2, which operate at a relatively low voltage, are protected from the power supply voltage $V_{PP}$ because the first through third NMOS transistors 2411, 2412, and 2413 are capable of enduring a high voltage.

The second voltage generation unit VG2 includes a third comparator COM3, fifth and sixth resistors R5 and R6, third and fourth inverters INV3 and INV4, fourth through seventh NMOS transistors 2415, 2416, 2417, and 2419, and a second PMOS transistor 2418. The fourth and seventh NMOS transistors 2415 and 2419 may be high voltage NMOS transistors, whereas the fifth and sixth NMOS transistors 2416 and 2417 may be depletion-mode NMOS transistors.

A second voltage V2 is distributed according to the values of the fifth and sixth resistors R5 and R6. The third comparator COM3 compares a voltage at the sixth resistor R6 with a third reference voltage Vref3 to generate a third comparison signal. In more detail, the third comparator COM3 generates a negative third comparison signal when the voltage at the sixth resistor R6 is greater than the third reference voltage Vref3, but generates a positive third comparison signal when the voltage at the sixth resistor R6 is less than the third reference voltage Vref3.

The third inverter INV3 inverts the third comparison signal to generate an inverted third comparison signal, and the fourth inverter INV4 inverts an output of the third inverter INV3 to restore the third comparison signal. The second PMOS transistor 2418 is turned on/off according to the output of the third inverter INV3 to provide the power supply voltage $V_{PP}$ to a second node N2. The seventh NMOS transistor 2419 is turned on/off according to a voltage of the second node N2 to provide the power supply voltage $V_{PP}$ to a terminal of the second voltage V2. In this case, the third and fourth inverters INV3 and INV4 and the third comparator COM3, which operate at a low voltage, are protected from the power supply voltage $V_{PP}$ because the fourth through sixth NMOS transistors 2415, 2416, and 2417 are capable of enduring a high voltage.

Figure 16:
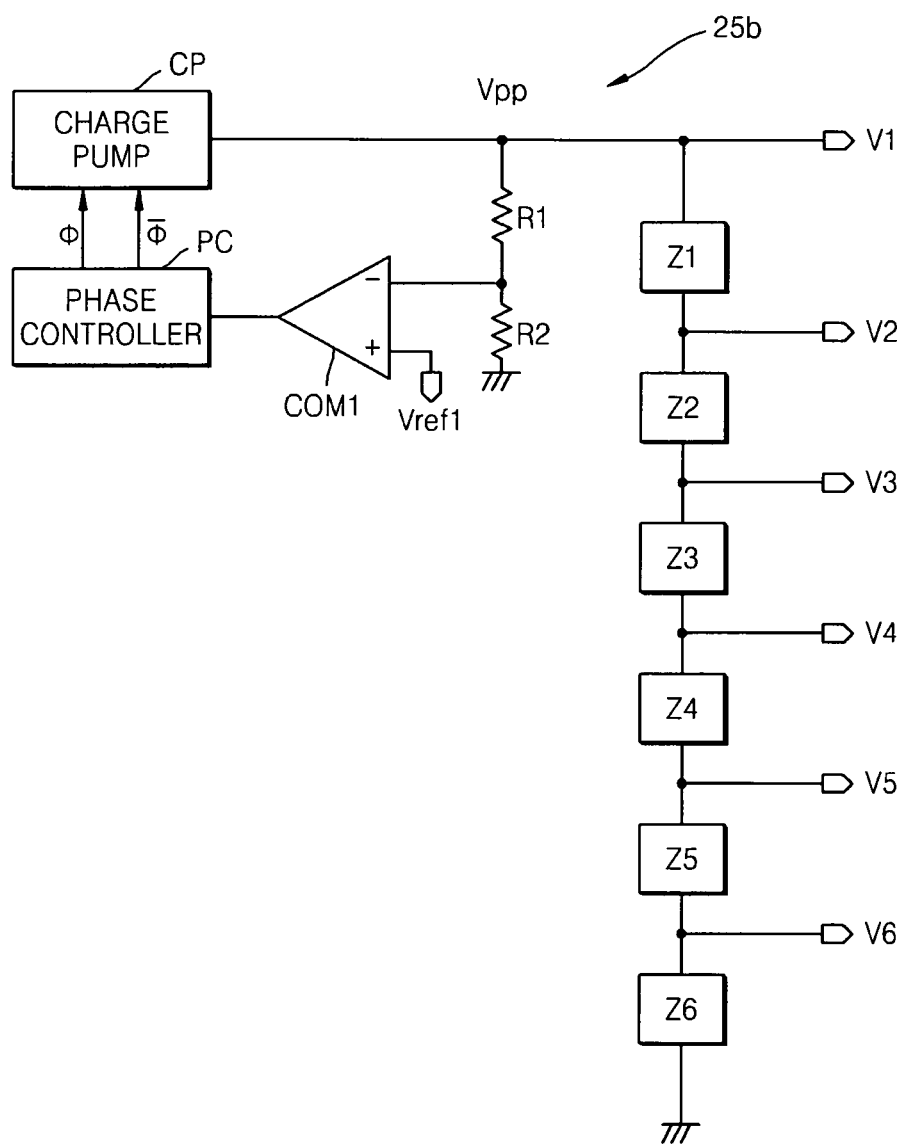
FIG. 16 is a circuit diagram of another example embodiment of the voltage generation unit of the driving unit shown in FIG. 9.

FIG. 16 is a circuit diagram of another example embodiment of the voltage generation unit 25 shown in FIG. 9.

Referring to FIG. 16, the voltage generation unit 25b includes a charge pump CP, a phase controller PC, a first comparator COM1, first and second resistors R1 and R2, and first through sixth passive devices Z1 through Z6. The voltage generation unit 25b according to at least this example embodiment is somewhat similar (at least in some aspects) to the voltage generation unit 25a of FIG. 15. Thus, a description of a duplicated portion thereof will be omitted here. A structure of the voltage generation unit 25b which is to be described below is only an example embodiment, and the structure of the voltage generation unit 25b is not limited thereto.

The power supply voltage $V_{PP}$ generated by the charge pump CP is distributed by the first through sixth passive devices Z1 through Z6, and thus the voltage generation unit 25b generates first through sixth voltages V1 through V6. The first through sixth voltages V1 through V6 are determined according to the impedances of the first through sixth passive devices Z1 through Z6. Thus, the first through sixth voltages V1 through V6 are changed by changing the impedances of the first through sixth passive devices Z1 through Z6.

Figure 17:
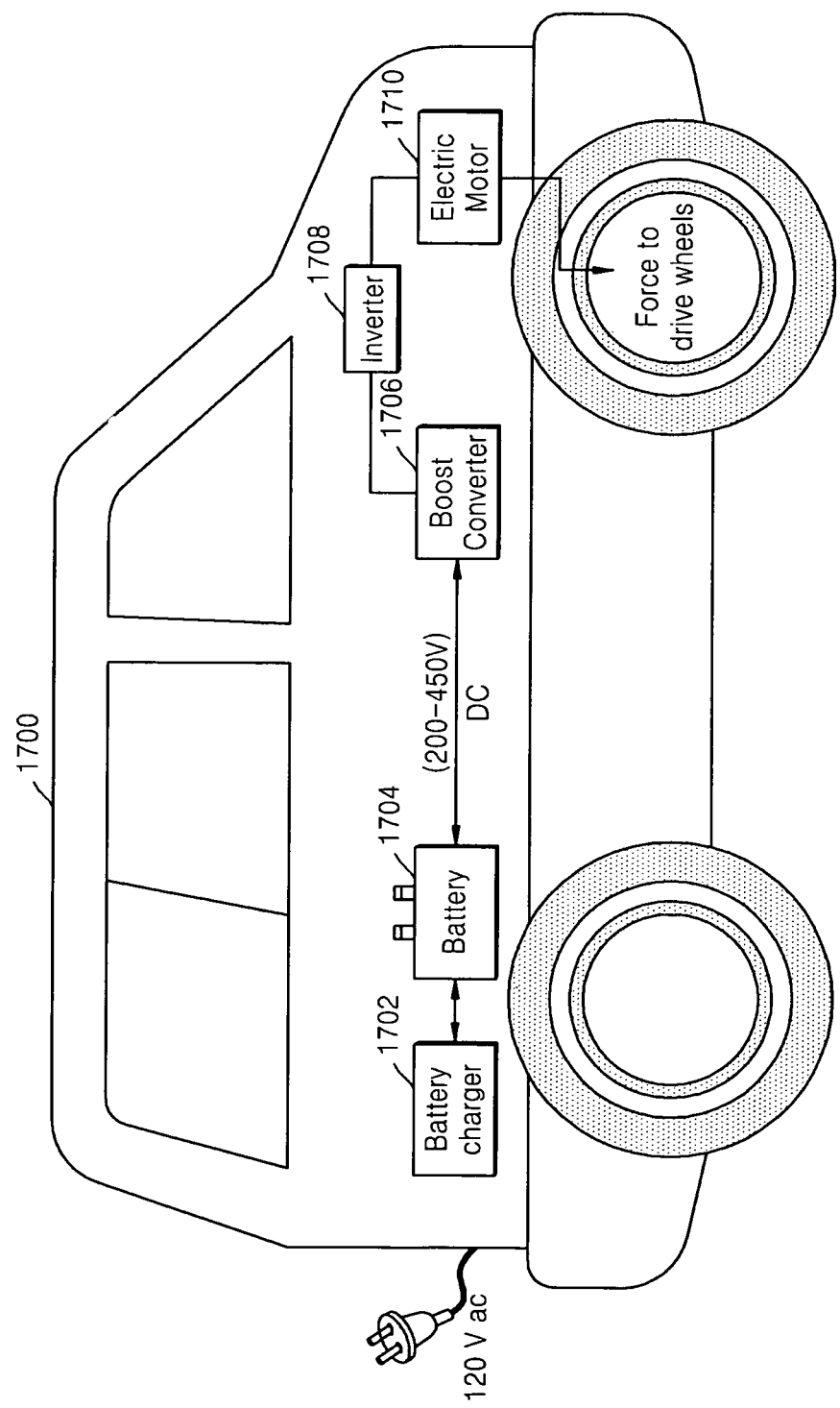
FIG. 17 illustrates an electric vehicle including a power device according to an example embodiment.

FIG. 17 illustrates an electric vehicle including a power device according to an example embodiment.

Referring to FIG. 17, the electric vehicle 1700 includes a battery charger 1702 configured to be plugged into a conventional wall outlet (e.g., 120V outlet) to charge a battery 1704. The battery 1704 provides power to drive the wheels of the vehicle 1700.

In more detail, the battery 1704 provides a power supply voltage to the boost converter 1706. The boost converter 1706 is configured to step-up the input voltage from the battery 1704 when the electric vehicle requires a higher operating voltage than the voltage which can be provided by the battery 1704. The boost converter 1706 outputs the stepped-up voltage to the inverter 1708.

The inverter 1708 is configured to convert the direct current (DC) from the boost converter 1706 to alternating current (AC), which provides phased power for vehicle traction motors and/or generators. The inverter 1708 outputs the AC power to an electric motor 1710.

The electric motor 1710 drives the wheels of the electric vehicle 1700 using the power from the inverter 1708.

In the electric vehicle 1700 shown in FIG. 17, one or more power devices described above with regard to FIGS. 1-16 may be utilized as, or as a component of, the boost converter 1706 and/or inverter 1708.

Figure 18:
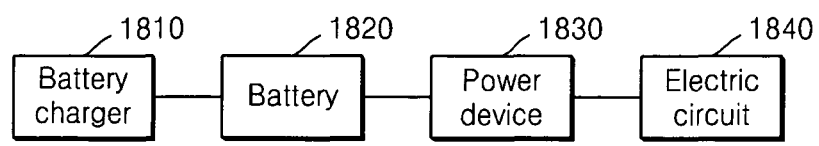
FIG. 18 illustrates an electric device including a power device according to an example embodiment.

FIG. 18 illustrates an electric device including a power device according to an example embodiment.

Referring to FIG. 18, the electric device 1800 includes a battery charger 1810, a battery 1820, a power device 1830 and an electric circuit 1840. The battery charger 1810 and the battery 1820 may be implemented in a manner similar or substantially similar to the battery charger 1702 and the battery 1704 illustrated in FIG. 17.

The battery 1820 provides a supply voltage to the power device 1830. The power device 1830 generates a power supply voltage by up-converting, down-converting and/or inverting the supply voltage from the battery 1820. The power device 1830 may include one or more power devices described above with FIGS. 1-16. The electric circuit 1840 receives the power supply voltage and operates according to the power supply voltage.

It should be understood that the example embodiments described herein should be considered in a descriptive sense only and not for purposes of limitation. Descriptions of features or aspects within each example embodiment should typically be considered as available for other similar features or aspects in other example embodiments.

What is claimed is:

1. A power device comprising:
a switching device having a control terminal and an output terminal, the control terminal being configured to receive a driving voltage and the output terminal being configured to output an output voltage, each of the driving voltage and the output voltage increasing with respect to time during a first time interval; and
a driving circuit configured to apply the driving voltage to the control terminal, the driving circuit being further configured to control a rise time of the driving voltage applied to the control terminal such that a voltage difference between the driving voltage at the control terminal and the output voltage at the output terminal remains less than or equal to a critical voltage while the driving voltage and the output voltage increase with respect to time, the critical voltage being a minimum voltage level at which leakage current is generated between the control terminal and the output terminal; wherein the driving circuit is configured to control the rise time of the driving voltage applied to the control terminal without feedback of the output voltage from the output terminal.

2. The power device of claim 1, wherein the rise time of the driving voltage is determined based on a rate at which a voltage of the control terminal increases with respect to time.

3. The power device of claim 1, wherein the driving circuit is further configured to delay a control signal for controlling the driving voltage for a delay period.

4. The power device of claim 3, wherein the driving circuit comprises:
a delay circuit configured to delay the control signal to generate a delayed control signal;
a pull-up circuit configured to apply a power supply voltage to the control terminal when the delayed control signal is active; and
a pull-down circuit configured to apply a ground voltage to the control terminal when the control signal is inactive.

5. The power device of claim 4, wherein the delay circuit further comprises:
a plurality of delay cells that are serially connected to one another, each of the plurality of delay cells being configured to delay the control signal for a unit delay period.

6. The power device of claim 5, wherein each of the plurality of delay cells comprises:
a delay circuit and a fuse configured to activate the delay circuit, the fuse being configured to be cut to control the rise time of the driving voltage.

7. The power device of claim 5, wherein each of the plurality of delay cells comprises:
a resistor;
at least one capacitor;
a first fuse connected in parallel with the resistor; and
at least one second fuse serially connected to the at least one capacitor, each delay cell being activated when the first fuse is cut, but the second fuse is not cut.

8. The power device of claim 4, wherein the delay circuit comprises:
a plurality of delay cells, which are serially connected to one another, each of the plurality of delay cells being configured to delay the control signal for a unit delay period; and
a delay cell selection circuit configured to generate a selection signal for selecting at least a portion of the plurality of delay cells to control the rise time of the driving voltage.

9. The power device of claim 8, wherein the delay cell selection circuit comprises a plurality of E-fuses connected to the plurality of delay cells, respectively, and
the plurality of E-fuses are configured to be cut to control the rise time of the driving voltage.

10. The power device of claim 8, wherein each of the plurality of delay cells comprises:
a resistor;
at least one capacitor;
a resistor switch connected in parallel with the resistor; and
at least one capacitor switch serially connected to the at least one capacitor, wherein the resistor switch and the at least one capacitor switch are turned on/off according to the selection signal provided by the delay cell selection circuit.

11. The power device of claim 1, wherein the driving voltage has a multi-step waveform in which at least one of a width and a height of each step varies.

12. The power device of claim 11, wherein the driving circuit comprises:
a driving signal generation circuit configured to generate a driving signal having a plurality of pulses, which are sequentially turned on and off;
a plurality of voltage generation circuits configured to generate different levels of voltages; and
a driving voltage providing circuit configured to apply a voltage generated by one of the plurality of voltage generation circuits to the control terminal as the driving voltage, according to the driving signal.

13. The power device of claim 12, wherein the plurality of pulses determine a time at which a voltage corresponding to a next step in the driving voltage is applied.

14. The power device of claim 12, wherein the driving signal generation circuit comprises:
an oscillator configured to generate a clock signal;
a pulse width control circuit configured to control a pulse width of the clock signal; and
a pulse generation circuit configured to sequentially generate the plurality of pulses having the controlled pulse width, when a pulse enable signal is active.

15. The power device of claim 14, wherein the pulse width control circuit is configured to control the pulse width of the clock signal based on the rise time of the driving voltage.

16. The power device of claim 12, wherein the driving voltage providing circuit comprises:
a plurality of switches connected to the plurality of voltage generation circuits, respectively, each of the plurality of switches being configured to be turned on and off according to a logic level of the driving signal.

17. The power device of claim 1, wherein the switching device comprises:
a transistor having a gate, a source, and a drain, wherein the control terminal corresponds to the gate, and the output terminal corresponds to the source.

18. An electric vehicle comprising:
the power device of claim 1, wherein the power device is configured to generate a power supply voltage by up-converting, down-converting and/or inverting a supply voltage from a battery; and
an electric motor configured to drive the electric vehicle according to the power supply voltage.

19. An electric device comprising:
the power device of claim 1, wherein the power device is configured to generate a power supply voltage by up-converting, down-converting and inverting a supply voltage; and
an electric circuit configured to receive the power supply voltage and operate according to the power supply voltage.

20. A driving circuit configured to provide a driving voltage to a control terminal of a switching device, the driving circuit comprising:
a delay circuit configured to delay a control signal for controlling supply of the driving voltage for a delay period to generate a delayed control signal, wherein the delay period is controlled according to a rise time required for the driving voltage to reach a target level;
a pull-up circuit configured to apply a power supply voltage to the control terminal in response to when the delayed control signal is active; and a pull-down circuit configured to apply a ground voltage to the control terminal in response to when the control signal is inactive, wherein a supply rise time of the driving voltage is controlled so that a voltage difference between the driving voltage applied to the control terminal and an output voltage at an output terminal of the switching device remains less than or equal to a critical voltage while the driving voltage and the output voltage increase with respect to time, the critical voltage being a minimum voltage level at which leakage current is generated between the control terminal and the output terminal, and the supply rise time of the driving voltage is controlled without feedback of the output voltage from the output terminal.

21. The driving circuit of claim 20, wherein the delay circuit comprises:

a plurality of delay cells serially connected to one another, each of the plurality of delay cells including, a delay circuit and a fuse configured to activate the delay circuit, the fuse being configured to be cut to control the supply rise time of the driving voltage.

22. The driving circuit of claim 20, wherein the delay circuit comprises:

a plurality of delay cells serially connected to one another; and a delay cell selection circuit configured to provide a selection signal for selecting at least a portion of the plurality of delay cells to control the supply rise time of the driving voltage.

23. The driving circuit of claim 22, wherein the delay cell selection circuit comprises:

a plurality of E-fuses connected to the plurality of delay cells, respectively, the plurality of E-fuses being configured to be cut to control the supply rise time of the driving voltage.

* * * * *